(12) United States Patent
Meir et al.

(10) Patent No.: US 8,953,372 B2
(45) Date of Patent: *Feb. 10, 2015

(54) MEMORY DEVICE READOUT USING MULTIPLE SENSE TIMES

(71) Applicant: Apple Inc., Cupertino, CA (US)

(72) Inventors: Avraham Poza Meir, Rishon Le-Zion (IL); Barak Baum, Givatayim (IL); Naftali Sommer, Rishon Le-Zion (IL)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/936,622

(22) Filed: Jul. 8, 2013

(65) Prior Publication Data

US 2013/0297989 A1 Nov. 7, 2013

Related U.S. Application Data

(63) Continuation of application No. 13/284,909, filed on Oct. 30, 2011, now Pat. No. 8,493,783, which is a continuation-in-part of application No. 13/214,257, filed on Aug. 22, 2011, now Pat. No. 8,400,858, which (Continued)

(51) Int. Cl.
*G11C 11/34* (2006.01)
*G06F 11/10* (2006.01)
(Continued)

(52) U.S. Cl.
CPC .............. *G06F 11/1008* (2013.01); *G11C 7/06* (2013.01); *G11C 8/08* (2013.01); *G11C 11/4091* (2013.01); *G11C 11/5642* (2013.01); *G11C 13/004* (2013.01); *G11C 13/0061* (2013.01);

(Continued)

(58) Field of Classification Search
CPC ............................ G06F 11/1008; G11C 7/06
USPC .......................... 365/185.03, 185.25, 185.09
See application file for complete search history.

(56) References Cited

U.S. PATENT DOCUMENTS

| | | | |
|---|---|---|---|
| 5,668,766 A | 9/1997 | Bramnik | |
| 7,236,407 B2 * | 6/2007 | Roohparvar et al. | .... 365/185.33 |

(Continued)

FOREIGN PATENT DOCUMENTS

| | | |
|---|---|---|
| JP | 61030826 | 2/1986 |
| KR | 20010003954 | 1/2001 |

(Continued)

OTHER PUBLICATIONS

Notice of Allowance from Korean Patent Application No. 10-2012-91871, mailed Feb. 26, 2014, Korean version, pp. 1-2.

(Continued)

*Primary Examiner* — Viet Q Nguyen
(74) *Attorney, Agent, or Firm* — Meyertons, Hood, Kivlin, Kowert & Goetzel, P.C.

(57) ABSTRACT

A method for data storage includes storing data in a group of analog memory cells by writing respective storage values into the memory cells in the group. One or more of the memory cells in the group are read using a first readout operation that senses the memory cells with a first sense time. At least one of the memory cells in the group is read using a second readout operation that senses the memory cells with a second sense time, longer than the first sense time. The data stored in the group of memory cells is reconstructed based on readout results of the first and second readout operations.

42 Claims, 6 Drawing Sheets

Related U.S. Application Data is a continuation-in-part of application No. 12/405,275, filed on Mar. 17, 2009, now Pat. No. 8,059,457.

(60) Provisional application No. 61/119,929, filed on Dec. 4, 2008, provisional application No. 61/037,327, filed on Mar. 18, 2008.

(51) Int. Cl.

| | | |
|---|---|---|
| *G11C 7/06* | (2006.01) | |
| *G11C 8/08* | (2006.01) | |
| *G11C 11/4091* | (2006.01) | |
| *G11C 11/56* | (2006.01) | |
| *G11C 13/00* | (2006.01) | |
| *G11C 16/26* | (2006.01) | |
| *G11C 16/34* | (2006.01) | |
| *G11C 27/00* | (2006.01) | |
| *G11C 8/12* | (2006.01) | |
| *G11C 29/00* | (2006.01) | |

(52) U.S. Cl.
CPC .............. *G11C16/26* (2013.01); *G11C 16/349* (2013.01); *G11C 27/005* (2013.01); *G11C 8/12* (2013.01); *G11C 29/00* (2013.01); *G11C 2211/5641* (2013.01)
USPC ............. 365/185.03; 365/185.25; 365/185.09

(56) References Cited

U.S. PATENT DOCUMENTS

| | | | |
|---|---|---|---|
| 7,421,557 B2 * | 9/2008 | Lee et al. ...................... 711/167 |
| 7,995,388 B1 | 8/2011 | Winter et al. |
| 8,009,480 B2 * | 8/2011 | Abiko et al. ............. 365/185.18 |
| 8,014,207 B2 | 9/2011 | Ryu |
| 8,059,457 B2 * | 11/2011 | Perlmutter et al. ...... 365/185.03 |
| 8,074,013 B2 | 12/2011 | Huang |
| 8,094,494 B2 | 1/2012 | Ho |
| 8,230,300 B2 * | 7/2012 | Perlmutter et al. ............ 714/763 |
| 8,238,157 B1 * | 8/2012 | Sommer et al. .......... 365/185.03 |
| 8,259,506 B1 * | 9/2012 | Sommer et al. .......... 365/185.24 |
| 8,400,858 B2 * | 3/2013 | Meir et al. ..................... 365/207 |
| 8,570,804 B2 * | 10/2013 | Shalvi et al. ............. 365/185.09 |
| 8,694,853 B1 * | 4/2014 | Sommer ....................... 714/763 |
| 2009/0282184 A1 | 11/2009 | Dutta et al. |
| 2010/0172187 A1 | 7/2010 | Dunga et al. |
| 2010/0182830 A1 | 7/2010 | Ryu et al. |
| 2011/0072191 A1 | 3/2011 | Huang et al. |
| 2011/0085378 A1 | 4/2011 | Ho et al. |
| 2014/0052940 A1 * | 2/2014 | Gurgi et al. ................... 711/154 |

FOREIGN PATENT DOCUMENTS

| | | |
|---|---|---|
| KR | 100850290 | 7/2008 |
| KR | 1020090017844 | 2/2009 |
| WO | 2010071655 | 6/2010 |

OTHER PUBLICATIONS

Notice of Allowance from Korean Patent Application No. 10-2012-92004, mailed Feb. 24, 2014, Korean version, pp. 1-2.

Preliminary Report on Patentability from PCT/US2012/050951, mailed Mar. 6, 2014, Apple Inc., pp. 1-10.

Preliminary Report on Patentability from PCT/US2012/050945, mailed Mar. 6, 2014, Apple Inc., pp. 1-10.

Office Action from Korean Application No. 10-2012-91871, mailed Aug. 26, 2013 (English Translation), pp. 1-5.

Office Action from Korean Application No. 10-2012-92004, mailed Aug. 26, 2013 (English Translation), pp. 1-5.

* cited by examiner

MEMORY DEVICE READOUT USING MULTIPLE SENSE TIMES

CROSS-REFERENCE TO RELATED APPLICATIONS

This application is a continuation of U.S. application Ser. No. 13/284,909 filed Oct. 30, 2011 which is a continuation in part of U.S. patent application Ser. No. 13/214,257, filed Aug. 22, 2011, now U.S. Pat. No. 8,400,858, issued Mar. 19, 2013, which is a continuation in part of U.S. patent application Ser. No. 12/405,275, filed Mar. 17, 2009, now U.S. Pat. No. 8,059,457, issued Nov. 15, 2011, which claims the benefit of U.S. Provisional Patent Application 61/119,929, filed Dec. 4, 2008 and U.S. Provisional Patent Application 61/037,327, filed Mar. 18, 2008. The disclosures of all these related applications are incorporated herein by reference.

FIELD OF THE INVENTION

The present invention relates generally to memory devices, and particularly to methods and systems for reading data from analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as storage values or analog values. In Flash memories, for example, each analog memory cell holds a certain amount of electrical charge. The range of possible analog values is typically divided into regions, each region corresponding to a programming state that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

SUMMARY OF THE INVENTION

A method for data storage includes storing data in a group of analog memory cells by writing respective storage values into the memory cells in the group. One or more of the memory cells in the group are read using a first readout operation that senses the memory cells with a first sense time. At least one of the memory cells in the group is read using a second readout operation that senses the memory cells with a second sense time, longer than the first sense time. The data stored in the group of memory cells is reconstructed based on readout results of the first and second readout operations.

In some embodiments, the memory cells in the group are coupled to respective bit lines, reading using the first readout operation includes charging the bit lines and measuring a discharge of the bit lines with the first sense time, and reading using the second readout operation includes measuring the discharge of the bit lines with the second sense time without re-charging the bit lines. In an embodiment, the memory cells in the group are associated with a single word line.

In a disclosed embodiment, reading using the second readout operation includes making an assessment of a success of the first readout operation, and performing the second readout operation only when the assessment indicates that the first readout operation failed. In an embodiment, making the assessment includes estimating an occurrence frequency of a given data value in the memory cells in the group, and comparing the estimated occurrence frequency to an expected value. In another embodiment, the method includes outputting at least part of the readout results of the first readout operation while simultaneously performing the second readout operation.

There is additionally provided, in accordance with an embodiment of the present invention, a method for data storage including storing multiple parts of an Error Correction Code (ECC) code word in multiple respective groups of analog memory cells. A first subset of the parts is read using a first readout configuration that reads the analog memory cells with a first sense time. A second subset of the parts, different from the first subset, is read using a second readout configuration that reads the analog memory cells with a second sense time, longer than the first sense time. The ECC code word is decoded using the read first and second subsets.

In some embodiments, storing the multiple parts includes storing the parts in respective different memory devices, and reading the first and second subsets includes reading the multiple parts from the respective memory devices simultaneously. In an embodiment, the method includes reading the multiple parts of an additional ECC code word from the multiple respective memory devices, such that the first and second subsets used in reading the parts of the additional code word are different from the first and second subsets used for reading the parts of the code word.

In a disclosed embodiment, each of the analog memory cells holds at least first and second bits, and storing the parts includes storing the parts that are to be read using the first readout configuration in the first bits, and storing the parts that are to be read using the second readout configuration in the second bits.

There is also provided, in accordance with an embodiment of the present invention, apparatus for data storage including multiple analog memory cells and circuitry. The circuitry is configured to store data in a group of the analog memory cells by writing respective storage values into the memory cells in the group, to read one or more of the memory cells in the group using a first readout operation that senses the memory cells with a first sense time, to read at least one of the memory cells in the group using a second readout operation that senses the memory cells with a second sense time, longer than the first sense time, and to reconstruct the data stored in the group of memory cells based on readout results of the first and second readout operations.

There is further provided, in accordance with an embodiment of the present invention, apparatus for data storage including multiple analog memory cells and circuitry. The circuitry is configured to store multiple parts of an Error Correction Code (ECC) code word in multiple respective groups of analog memory cells, to read a first subset of the parts using a first readout configuration that reads the analog memory cells with a first sense time, to read a second subset of the parts, different from the first subset, using a second readout configuration that reads the analog memory cells with a second sense time, longer than the first sense time, and to decode the ECC code word using the read first and second subsets.

The present invention will be more fully understood from the following detailed description of the embodiments thereof, taken together with the drawings in which:

DETAILED DESCRIPTION OF EMBODIMENTS

Overview

Figure 1:
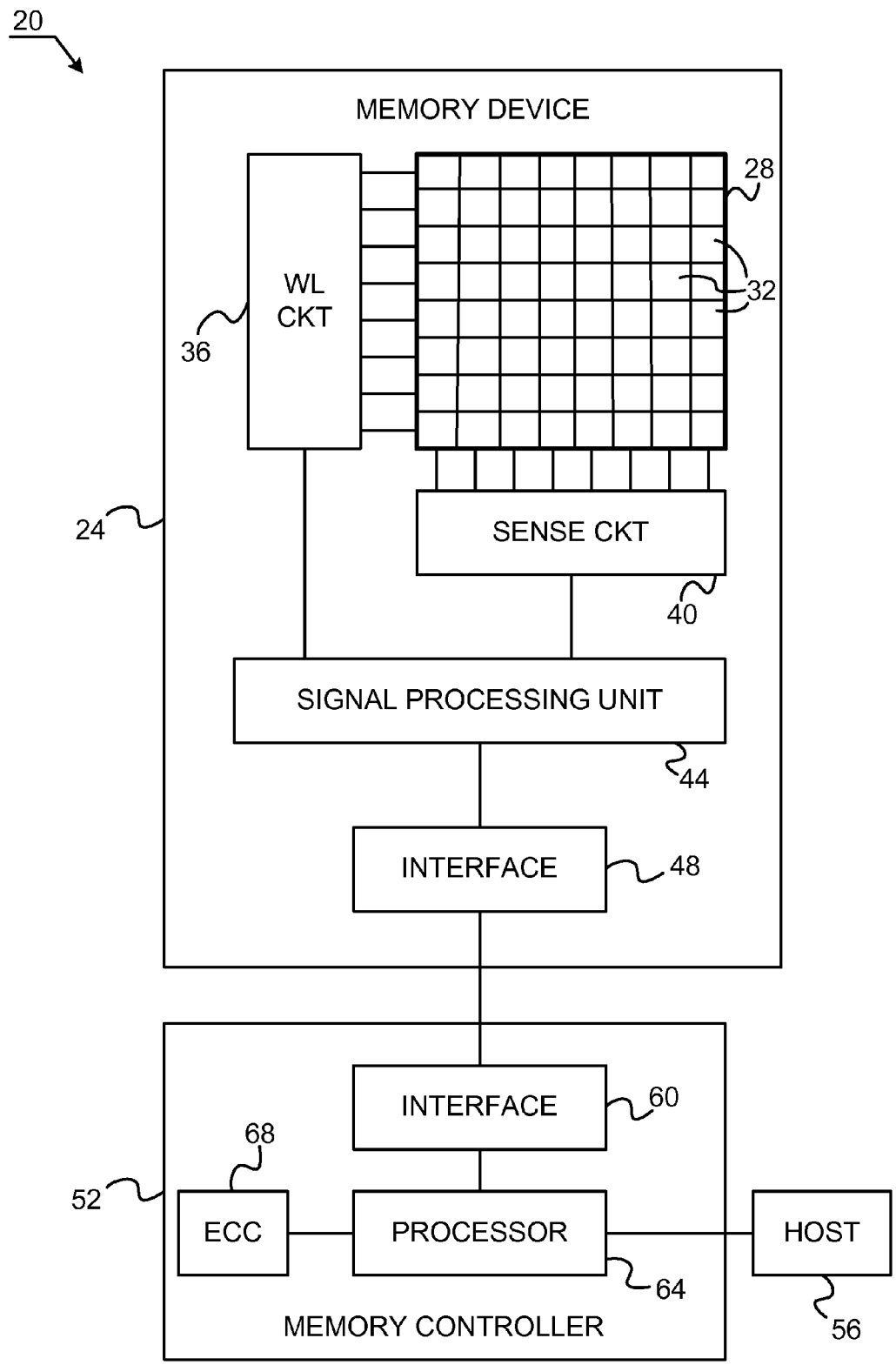
FIG. 1 is a block diagram that schematically illustrates a memory system, in accordance with an embodiment of the present invention.

Data is typically stored in analog memory cells by programming the cells with certain storage values (e.g., threshold voltages) that represent the data. The data is retrieved by reading the storage values from the cells. Usually, a trade-off exists between the accuracy with which the storage values are read and the time needed to read them. Highly-accurate read operations tend to be relatively long and may limit the overall data retrieval speed.

In practice, however, highly-accurate readout is not always mandatory. Some readout tasks can be carried out successfully with reduced accuracy, and therefore with higher speed. Reduced accuracy can be sufficient, for example, when the memory cells are at the beginning of their life cycle and thus have gone through only a few programming and erasure cycles. As another example, when canceling interference in given memory cells based on the storage values of neighboring cells, the given cells are typically read with high accuracy. The neighboring cells, however, can often be read with lower accuracy with little or no degradation in cancellation performance.

As yet another example, when programming the cells using a Program and Verify (P&V) process, the programmed storage values can be verified with a lower accuracy than the accuracy used for data retrieval. Read operations for estimating the statistical distribution of the storage values (e.g., for adjusting read thresholds) can often be performed with lower accuracy, as well.

Embodiments of the present invention that are described hereinbelow provide improved methods and systems for reading data from analog memory cells. These methods and systems combine multiple types of readout operations having different sense times. For a memory cell belonging to a certain bit line, the sense time used for reading the memory cell is defined as the time duration over which the bit line voltage or current is integrated.

In some memory devices, a group of memory cells along a selected word line is read by charging the bit lines of the memory cells, allowing the bit lines to discharge, and sensing the bit line currents or voltages during the discharge cycle. In some embodiments that are described herein, a group of memory cells is read using multiple read operations that sense the bit lines with different sense times, all during the same bit line discharge cycle. In other words, a given bit line is sensed with multiple sense times without re-charging the bit line between the read operations.

In some of these embodiments, the memory device circuitry senses the bit lines (and thus the memory cells) with a certain sense time, and then performs a fast verification process that assesses whether the first readout operation is likely to have been successful. For example, the circuitry may estimate the occurrence frequency of a certain data value and compare it with an expected value. If the verification process indicates a possible readout failure (implying that the initial sense time was too short), the circuitry senses the bit lines again with a longer sense time.

The process of verifying the readout success and conditionally increasing the sense time can be repeated iteratively, e.g., until the verification indicates successful readout. The entire process is typically performed during a single bit line discharge cycle. This technique optimizes the latency vs. readout reliability trade-off for each group of memory cells, to match the actual conditions of the memory cells.

In other embodiments, a first subset of the memory cells in the group is read with a certain sense time, and a second subset is read with a longer sense time. The readout results of the first subset are transferred from the memory to a memory controller while readout of the second subset (with the longer sense time) is still in progress. This technique, too, provides a good trade-off between latency and readout accuracy: Latency is kept low because data transfer is initiated after the first subset is read with the shorter sense time. At the same time, the average readout accuracy is kept high by reading the second subset (whose data transfer begins later) with a longer sense time.

In other disclosed embodiments, the entire group of memory cells is sensed twice, using two different sense times. The readout results corresponding to the shorter sense time are available first. If these read results are corrupted, the readout results corresponding to the longer sense time are used when they become available.

In other embodiments that are described herein, data encoded with an Error Correcting Code (ECC) is read using multiple different sense times. In these embodiments, each ECC code word is divided into multiple parts, and each part is stored in a different group of memory cells (e.g., in a different page or even a different memory die). When retrieving the ECC code word from memory, one or more of the parts are read using a first sense time, and one or more other parts are read with a different sense time. This technique is useful, for example, when the error rate corresponding to the shorter sense time is too high to be corrected by the ECC decoder. By reading a portion of the ECC code word with a longer sense time (and thus lower error rate), the average number of errors per code word is reduced to match the error correction capability of the decoder.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. Memory device 24 and memory controller 52 may support multiple read commands, which read memory cells 32 at different accuracy levels and have different execution times. The use of these multiple read commands is addressed in detail hereinbelow. Additionally or alternatively, memory device 24 and memory controller 52 may support multiple readout configurations having different sense times. In some embodiments, the memory device and memory controller communicate with each other using a dedicated command interface in order to implement the multiple read commands or configurations defined herein.

In the context of the present patent application and in the claims, the term "analog memory cell" is used to describe any memory cell that holds a continuous, analog level of a physical quantity, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

Memory cells 32 of array 28 are typically arranged in a grid having multiple rows and columns, commonly referred to as word lines and bit lines, respectively. Cells are typically erased in groups of word lines that are referred to as erasure blocks. In some embodiments, a given memory device comprises multiple memory cell arrays, which may be fabricated on separate dies.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming states are selected from a finite set of possible states, and each state corresponds to a certain nominal storage value. For example, a 2 bit/cell MLC can be programmed to assume one of four possible programming states by writing one of four possible nominal storage values to the cell.

Memory device 24 comprises Reading/Writing (R/W) circuitry, which converts data for storage in the memory device to storage values and writes them into memory cells 32. In alternative embodiments, the R/W circuitry does not perform the conversion, but is provided with voltage samples, i.e., with the storage values for storage in the cells. When reading data out of array 28, the R/W circuitry converts the storage values of memory cells 32 into digital samples having a resolution of one or more bits. The R/W circuitry typically reads data from cells 32 by comparing the storage values of the cells to one or more read thresholds. Data is typically written to and read from the memory cells in groups that are referred to as pages. In some embodiments, the R/W circuitry can erase a group of cells 32 by applying one or more negative erasure pulses to the cells.

In the present example, the R/W circuitry comprises Word Line (WL) circuitry 36 and sense circuitry 40. The WL circuitry is connected to the word lines of array 28, and the sense circuitry is connected to the bit lines of the array. Among other tasks, WL circuitry 36 applies appropriate bias voltages to the different word lines during read operations, and applies appropriate programming pulses to word lines during programming operations. Sense circuitry 40, among other functions, senses the voltages or currents of the bit lines during read operations.

The R/W circuitry typically reads a group of memory cells 32 along a certain word line simultaneously. In a typical read operation, WL circuitry 36 applies the appropriate bias voltages to the read word line and to the other word lines in the same erasure block. Sense circuitry 40 senses the voltage or current of each bit line. The sensed voltage or current of a given bit line is indicative of the storage value of the memory cell that belongs to this bit line and to the read word line. The sense circuitry typically compares the sensed bit line voltages or currents to one or more read thresholds, and outputs the comparison results.

In some embodiments, memory device 24 comprises a signal processing unit 44, which applies various signal processing mechanisms to the read and/or programmed data or storage values. In particular, unit 44 may apply signal processing mechanisms that enhance the accuracy of reading the storage values from memory cells 32, such as interference cancellation or read threshold adaptation. The use of these mechanisms is addressed in greater detail below. Signal processing unit 44 communicates with WL circuitry 36 and with sense circuitry 40. Additionally, the signal processing circuitry communicates with elements external to device 24 via an interface 48.

The storage and retrieval of data in and out of memory device 24 is performed by a memory controller 52. Controller 52 comprises an interface 60 for communicating with device 24, and a processor 64 that carries out the memory control functions described herein. In some embodiments, memory controller 52 comprises an Error Correction Code (ECC) unit 68, which encodes the data for storage using a suitable ECC, and decodes the ECC of data read from the memory device. In some embodiments, controller 52 produces the storage values for storing in the memory cells and provides these values to device 24. Alternatively, controller 52 may provide the data for storage, and the conversion to storage values is carried out in the memory device.

Memory controller 52 communicates with a host 56, for accepting data for storage in the memory device and for outputting data retrieved from the memory device. In some embodiments, some or even all of the functions of controller 52 may be implemented in hardware. Alternatively, controller 52 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. For example, in some embodiments signal processing unit 44 may be omitted, and its functions performed by the memory controller. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and memory controller 52 are implemented as two separate Integrated Circuits (ICs). In alternative embodiments, however, the memory device and the memory controller may be integrated on separate semiconductor dies in a single Multi-Chip Package (MCP) or System on Chip (SoC). Further alternatively, some or all of the circuitry of the memory controller may reside on the same die on which the memory array is disposed. Further alternatively, some or all of the functionality of controller 52 can be implemented in software and carried out by a processor or other element of the host system. In some implementations, a single memory controller may be connected to multiple memory devices 24. In yet another embodiment, some or all of the memory controller functionality may be carried out by a separate unit, referred to as a memory extension, which acts as a slave of memory device 24. Typically, processor 64 in controller 52 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Trade-Off Between Readout Accuracy and Speed

Typically, a trade-off exists between the accuracy at which memory device 24 reads the storage values from memory cells 32, and the speed at which the storage values are read. Highly-accurate readout tends to be relatively slow, whereas fast readout often has a reduced accuracy. In the present context, the term "accuracy" means any measure of the certainty or fidelity at which the storage values read by the circuitry of memory device 24 represent the actual storage values stored in the memory cells. In an accurate read operation, the differences between the read storage values and the respective actual storage values of the memory cells are small, and vice versa. Since any read operation has some inherent uncertainty, different read operations can be characterized by their reading accuracies. Several examples of read commands having different accuracies are described further below. The terms "high accuracy" and "fine accuracy" are used interchangeably herein.

In many practical cases, highly-accurate readout is not always needed. Some readout tasks can be carried out successfully at a reduced reading accuracy, and therefore at a higher speed. In some embodiments, memory device 24 and memory controller 52 support multiple predefined types of read commands for reading the storage values from memory cells 32. The different commands read the storage values at different accuracies. Each command has a respective execution time, which is typically longer for higher-accuracy commands and shorter for lower-accuracy commands.

Typically, when memory controller 52 prepares to read the storage values from a certain group of memory cells (e.g., a memory page), the controller evaluates a condition related to the read operation to be performed. Based on the evaluated condition, the memory controller selects one of the predefined read commands, and instructs the memory device to read the storage values in question using the selected command. Several examples of readout tasks that can be performed at different accuracy levels, of conditions that can be evaluated so as to select the appropriate read command, and of read commands having different accuracies and execution times, are described in detail below.

Figure 2:
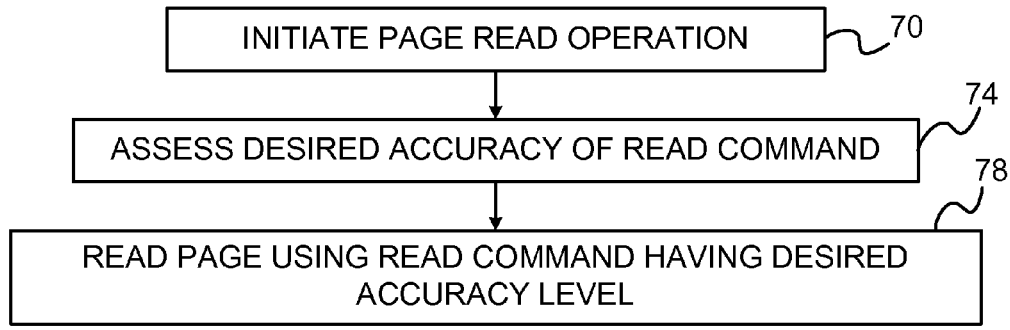
FIGS. 2 and 3 are flow charts that schematically illustrate methods for retrieving data from analog memory cells using read commands having different accuracy levels, in accordance with embodiments of the present invention.

FIG. 2 is a flow chart that schematically illustrates a method for retrieving data from analog memory cells 32 using read commands having different accuracy levels, in accordance with an embodiment of the present invention. The method begins with memory controller 52 initiating readout of a certain memory page, which is stored in a group of memory cells 32, at an initiation step 70. The memory controller assesses the desired readout accuracy by evaluating a condition related to the read operation to be performed, at an accuracy assessment step 74. The memory controller selects one of the predefined read commands, which has the desired accuracy, and reads the storage values corresponding to the page using the selected command, at a reading step 78. The memory controller typically reconstructs the stored data from the read storage values and outputs the reconstructed data to host 56.

Example Readout Tasks, Selection Criteria and Read Commands

The different read commands supported by memory device 24 and memory controller 52 may differ from one another in various ways, in order to provide different accuracy/speed trade-offs. For example, different read commands may have different sense times. The sense time is defined as the time duration over which sense circuitry 40 measures the bit line voltages or currents during a read operation. As can be appreciated, integrating the bit line current or voltage over a longer time duration averages the read noise and improves the readout accuracy. On the other hand, a longer sense time increases the execution time of the read command. Thus, device 24 and controller 52 may support a high-accuracy but relatively slow read command having a long sense time, and a lower-accuracy but relatively fast read command having a short sense time. In a certain NAND Flash device, for example, the long sense time may be on the order of 25 μS and the short sense time may be on the order of 10 μS, although any other suitable values can also be used. In some embodiments, the long sense time may be approximately twice the length of the short sense time, although any other suitable ratio can also be used.

As another example, different read commands may read the storage values using different numbers of read thresholds. As noted above, the R/W circuitry typically reads the storage values from memory cells 32 by comparing them to one or more read thresholds. In some embodiments, signal processing unit 44 can improve the reading accuracy by re-reading a certain set of storage values multiple times, using different read thresholds. For example, the multiple read results can be combined to form soft metrics of the read storage values, and these metrics can be used by ECC unit 68 in the memory controller to decode the ECC. Some aspects of data readout using multiple read thresholds are addressed in PCT International Publications WO 2007/132457, WO 2008/053472, WO 2008/111058 and WO 2008/139441, whose disclosures are incorporated herein by reference.

Typically, the readout accuracy improves as the number of read thresholds increases. On the other hand, re-reading a group of memory cells using a large number of read thresholds increases execution time. Thus, read commands that use different numbers of read thresholds will typically have different reading accuracies and execution times. In an embodiment, the memory device and memory controller may support a read command that reads the storage values using a small number of read thresholds (e.g., a single read threshold), and another read command that reads the storage values using a higher number of read thresholds (e.g., between two and five read thresholds).

When a given read commands uses a single read threshold, the read results can be viewed as hard metrics of the storage values. When a given read command uses multiple read thresholds, the read results can be combined or otherwise processed to produce soft metrics of the storage values. ECC unit 68 may decode the ECC based on these hard or soft metrics. Thus, a relatively fast command can be specified to produce hard metrics. A slower command may be specified to produce soft metrics, which generally enable higher accuracy in decoding the ECC. Alternatively, different commands that use different numbers of read thresholds can be viewed as producing soft metrics having different accuracies.

Typically, multiple-threshold readout is carried out by unit 44 internally to the memory device. In a typical process, the memory controller selects and sends the appropriate read command to the memory device, and the memory device executes the command by reading the storage values using the appropriate number of read thresholds.

In some embodiments, signal processing unit 44 applies certain signal processing mechanisms to the read storage values in order to increase their accuracy. For example, unit 44 may apply an interference cancellation process for canceling interference that distorts the read storage values. Techniques for estimating and cancelling distortion in memory cells are described, for example, in PCT International Publications WO 2007/132452, WO 2007/132453 and WO 2008/026203, whose disclosures are incorporated herein by reference, and in PCT International Publications WO 2007/132457, cited above. As another example, signal processing unit 44 may apply a mechanism that adaptively adjusts the positions of the read thresholds that are used for reading the storage values. Techniques for adaptively adjusting read threshold values are described, for example, in PCT International Publications WO 2008/053472 and WO 2008/111058, cited above.

Signal processing mechanisms, such as interference cancellation or adaptive threshold adjustment, improve the readout accuracy. On the other hand, these mechanisms are typically computationally intensive and therefore increase execution time and readout speed. Thus, in some embodiments, different read commands can apply signal processing mechanisms having different execution times, or refrain from applying such mechanisms, and as a result provide different accuracy/speed trade-offs.

For example, a given read command may apply interference cancellation to the read storage values, and another read command may read the storage values without applying interference cancellation. As another example, a given read command may adjust the read thresholds before reading the storage values, and another read command may read the storage values without adjusting the read thresholds.

In some embodiments, both unit 44 and memory controller 52 have signal processing capabilities. For example, an interference cancellation process or threshold adjustment process can be split between unit 44 and processor 52, such that each entity carries out a subset of the signal processing tasks. Memory controller 52 is often capable of carrying out complex signal processing tasks as it often has a higher processing power than unit 44. Thus, moving signal processing functions from unit 44 to controller 52 may improve the readout accuracy. On the other hand, performing signal processing tasks by the memory controller often involves transferring larger volumes of data from the memory device to the memory controller, which increases the execution time. Thus, the partitioning of signal processing tasks between the memory controller and the memory device may provide different accuracy/speed trade-offs. Therefore, different read commands may split the signal processing tasks differently between the memory controller and the memory device.

For example, a certain read command may apply a fast but limited-accuracy threshold adaptation process internally to the memory device. Another read command may apply a more complex and higher-accuracy threshold adaptation process by the memory controller. The latter command is typically slower, since it involves transferring of larger amounts of data (results of re-read operations) from the memory device to the memory controller.

As another example, unit 44 in the memory device may be configurable to perform a limited-performance interference cancellation process on the data read from the memory cells. Memory controller 52 may be configurable to perform a high-performance interference cancellation process, which may be slower than the process applied internally to the memory device. A certain read commands may use only the interference cancellation process applied in the memory device. Another read command may use only the controller's interference cancellation process. Yet another read command may apply both processes to the read data.

The read commands described above are chosen purely by way of example. In alternative embodiments, memory device 24 and memory controller 52 may use any other suitable set of two or more predefined read commands, which have different readout accuracies and execution times. In particular, the example techniques described above can be combined to produce commands having various accuracy/speed trade-offs. For example, a highly-accurate read command may use a long sense time, apply interference cancellation and read the storage values using multiple thresholds that are adjusted adaptively. A low-accuracy but high-speed read command may use a short sense time and read the storage values using a single, fixed read threshold.

Memory controller 52 may evaluate different conditions in order to select one of the predefined read commands for performing a given readout task. For example, a group of memory cells that has gone through a large amount of wear (e.g., a large number of programming and erasure cycles and/or long retention periods) may suffer from a high level of distortion, and should therefore be read at high accuracy. A group of memory cells that has gone through a small amount of wear may be read successfully at a lower accuracy and at a higher speed. Thus, in some embodiments, the memory controller selects the read command based on the wear level of the memory cells to be read. Any suitable measure or estimate of the wear level can be used, such as the actual or estimated number of programming and erasure cycles applied to the cells, and/or the time that elapsed since the last programming operation.

This sort of condition may be applied to each individual group of cells, assuming that wear level information is available per cell group. Alternatively, the memory controller may apply the selection jointly for an entire block or even to the entire memory device. For example, the memory controller may use a fast but low-accuracy read command at the beginning of the memory device's lifetime, and switch to a higher-accuracy but slower read command at a later point along the lifetime of the memory device.

As another example, the memory controller may initially select a fast read command by default. If the data cannot be reconstructed successfully using this read command (e.g., if ECC decoding fails), the memory controller may re-attempt to read the storage values using a slower but higher-accuracy command.

In some embodiments, the read command is selected internally in the memory device, such as by signal processing unit 44 or by the R/W circuitry. For example, applying interference cancellation to a certain group of memory cells typically involves reading the storage values from both the interfered memory cells and other memory cells (typically neighboring cells) that potentially cause the interference. In many practical cases, the interference can be canceled successfully even if the storage values of the interfering memory cells are known at a low accuracy. Thus, when applying interference cancellation, the memory device may read the storage values of the potentially-interfering cells using a fast but low-accuracy command.

In some embodiments, memory cells 32 comprise multi-level cells, each storing multiple data bits. In many data storage schemes, different bits in a group of memory cells are used for storing different memory pages. Consider, for example, a group of 3 bit/cell memory cells. Each memory cell stores three bits, which are referred to as a Least Significant Bit (LSB), a Center Significant Bit (CSB) and a Most Significant Bit (MSB). The LSBs of the cells in the group are used for storing a certain page, the CSBs store a different page, and yet another page is stored in the MSBs. In these embodiments, the pages stored in different significance bits often have different error probabilities. Therefore, different significance bits can be read using different read commands. This selection can be performed either by the memory controller or by the memory device, as appropriate.

As yet another example, the R/W circuitry may program the memory cells using an iterative Program and Verify (P&V) process. In a typical P&V process, an entire memory page is written by applying a sequence of programming pulses to the group of memory cells that are mapped to this page. The amplitude of the programming pulses increases incrementally from pulse to pulse. The storage values programmed into the cells are read ("verified") after each pulse, and the iterations continue until the desired levels are reached. Typically, programming verification can be performed successfully even if the storage values are read at a low accuracy. Thus, the R/W circuitry may read the storage values during verification reading tasks using a fast but low-accuracy command.

As another example, in some embodiments the memory device or the memory controller adjusts the read thresholds used in read operations, based on the statistical distribution of the storage values stored in the memory cells. For example, device 24 or controller 52 may perform one or more read operations for estimating the Cumulative Distribution Function (CDF) of the cell storage values, and then adjust the read thresholds based on the estimated CDF. Techniques of this sort are described, for example, in PCT International Publication WO 2008/111058, cited above. Typically, read operations performed in order to estimate the storage value distribution can be performed at low accuracy.

Further alternatively, the appropriate predefined read command for performing a certain readout task can be selected based on any other suitable condition. For example, two or more of the above-mentioned conditions can be combined. Although certain conditions are referred to above as being evaluated by the memory controller, the condition evaluation and/or command selection can be performed by the memory controller or by circuitry internal to the memory device, as desired.

In some embodiments, the memory controller configures the memory device so as to set various attributes of the read commands. The memory controller may configure any read command attribute, such as, for example, the number and values of read thresholds, sense times and/or interference cancellation parameters. The controller may configure attributes of a single read command, all commands or a subset of the commands. In some embodiments, the memory controller may estimate the impairments in the memory cells along the memory device's life cycle, and adapt the read command attributes accordingly.

Progressive Selection of Read Commands

In some embodiments, memory controller 52 initially reads data from memory device 24 using fast and limited-accuracy read commands. The memory controller reverts to higher-accuracy but slower read commands only if data readout fails.

Figure 3:
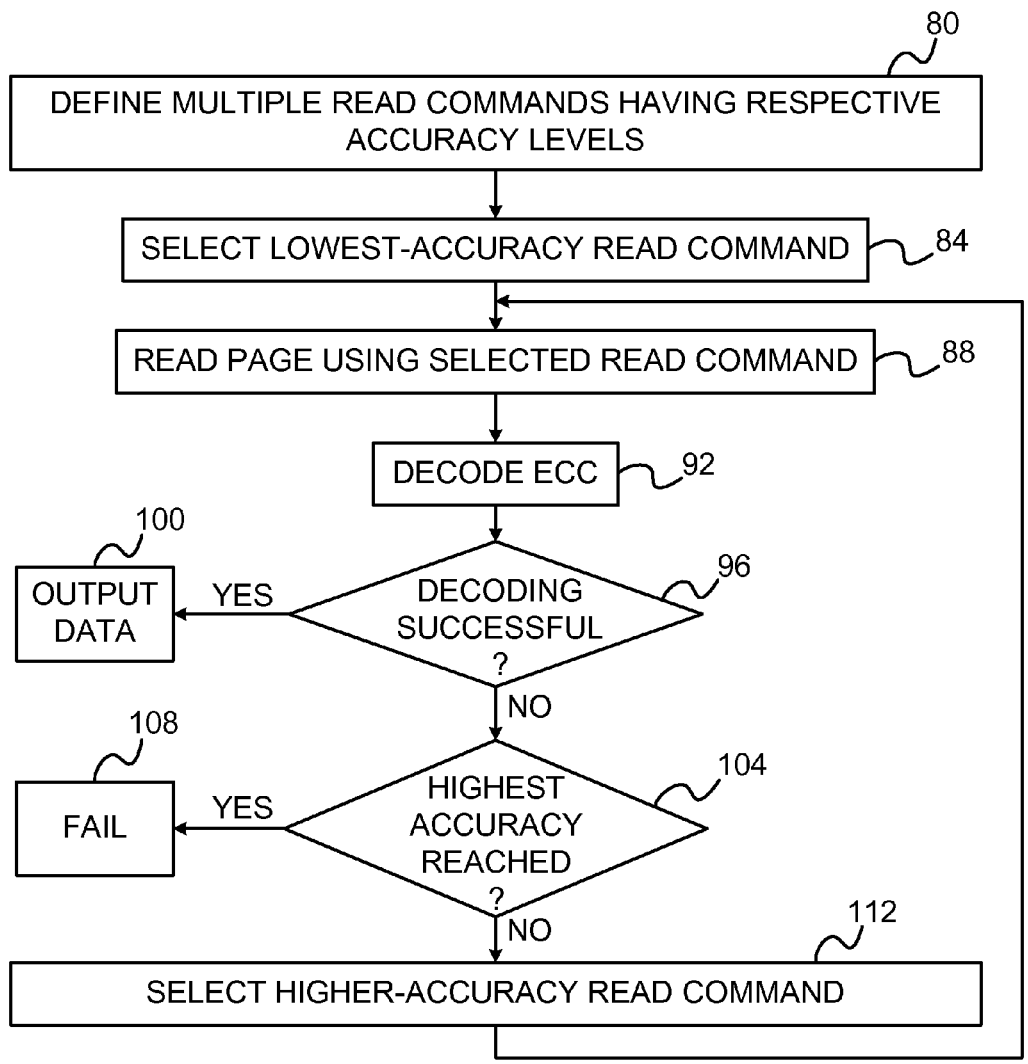

FIG. 3 is a flow chart that schematically illustrates a method for retrieving data from analog memory cells 32 using read commands having different accuracy levels, in accordance with an embodiment of the present invention. The method begins by defining multiple read commands having respective different accuracy levels, at a definition step 80. These commands are supported by both memory device 24 and memory controller 52.

When preparing to read the storage values from a certain group of memory cells (e.g., to read a certain memory page), the memory controller initially selects the read command having the lowest accuracy, at an initial selection step 84. This command typically has the shortest execution time.

The memory controller instructs the memory device to read a certain page using the currently-selected read command, at a reading step 88. The memory device reads the requested page using this command and provides the read results to the memory controller.

The memory controller attempts to decode the ECC based on the read results provided by the memory device, in order to reconstruct the data, at an ECC decoding step 92. The memory controller checks whether ECC decoding is successful, at a decoding checking step 96. If successful, the memory controller output the reconstructed data to host 56, at an output step 100, and the method terminates.

If, on the other hand, ECC decoding has failed, the memory controller checks whether the currently-selected read command is the command having the highest accuracy, at an accuracy checking step 104. If the currently-selected read command is the highest-accuracy command, the memory controller declares that the page read operation has failed, at a failure step 108, and the method terminates.

Otherwise, the memory controller selects a different read command, whose accuracy is higher than that of the currently-selected command, at a selection update step 112. The method then loops back to step 88 above, in which the memory controller reads the requested page using the newly-selected read command. The memory controller continues to read the requested page using read commands that progressively increase in accuracy, until ECC decoding is successful or until all predefined commands have been exhausted.

Using the progressive method of FIG. 3, the readout accuracy is matched to the actual characteristics of the page in question. The memory controller attempts to read the data using fast read commands first, and reverts to slower commands only if higher accuracy is needed.

When the memory controller re-reads a certain page using a high-accuracy command after failure of a lower-accuracy command, the memory controller can still use the results of the lower-accuracy command that failed. For example, the results of the lower-accuracy command can be combined with (or otherwise used to refine) the read results of the higher-accuracy command. Consider, for example, the above-mentioned configuration in which both the controller and the memory device are capable of performing interference cancellation. In such a configuration, the controller may initially read the page with a fast read command that performs no interference cancellation. If the ECC fails, the controller re-reads the page with a command that activates the memory device's interference cancellation mechanism. If the ECC fails again, the memory controller may apply both the memory device's and the memory controller's interference cancellation mechanisms.

In some embodiments, the memory device and memory controller support a command interface, using which the memory controller instructs the memory device to execute the appropriate read commands. Such commands may instruct the memory controller to apply a certain predefined read command (e.g., a command having a certain sense time), to activate or deactivate a certain signal processing mechanism implemented internally to the memory device, to set attribute values such as read thresholds or interference cancellation parameters, and/or to instruct the memory device to perform any suitable action or configure any suitable attribute in order to execute the read commands described herein.

Readout Configurations with Reduced Sense Time

In some embodiments, system 20 employs multiple readout configurations having different sense times, i.e., different time durations over which sense circuitry 40 measures the bit line voltages or currents during a read operation. When preparing to retrieve data from a certain group of memory cells, the system evaluates a certain condition, and selects the appropriate readout configuration based on this condition. Several examples of such readout configurations are described below.

Although the embodiments described below refer to two readout configurations—a normal configuration and a reduced-sense-time configuration—the disclosed techniques can be used with any other suitable number of readout configurations having different sense times. In some embodiments, memory controller 52 and memory device 24 support one or more readout commands using which the memory controller specifies the readout configuration to be used for retrieving certain data. In alternative embodiments, the memory device evaluates the condition and selects the appropriate readout configuration irrespective of the memory controller.

Figure 4:
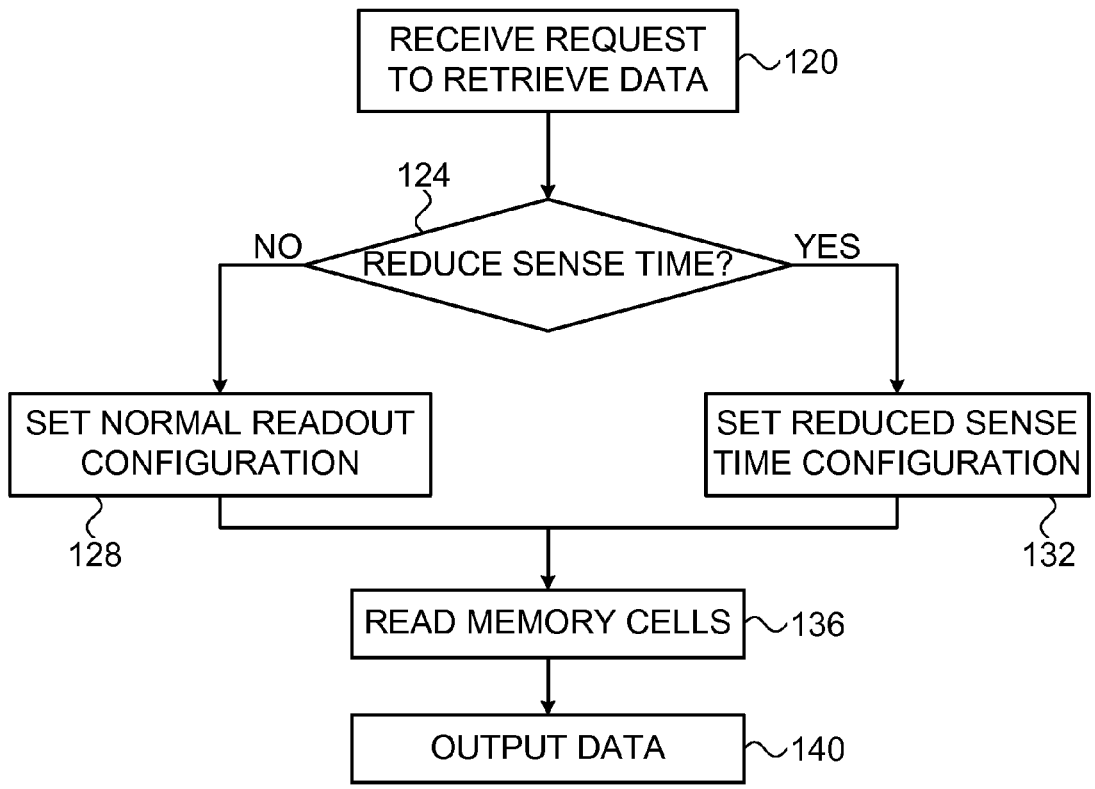
FIG. 4 is a flow chart that schematically illustrates a method for retrieving data from analog memory cells with reduced sense time, in accordance with an embodiment of the present invention.

FIG. 4 is a flow chart that schematically illustrates a method for retrieving data from analog memory cells 32 with reduced sense time, in accordance with an embodiment of the present invention. The method begins with memory controller 52 accepting a request from host 56 to retrieve certain data, at a request step 120. The data in question is stored in a certain group of memory cells 32, e.g., in a certain page that belongs to a certain word line.

The memory controller holds a definition of two or more readout configurations that differ from one another in sense time. The present example refers to two readout configurations—a normal configuration and a reduced-sense-time configuration. The memory controller evaluates a condition that indicates whether the memory cell group in question is to be read using the normal or the reduced-sense-time readout configuration, at a condition evaluation step 124. Any suitable condition can be used for this purpose. For example, the memory controller may use any of the above-described conditions used for selecting read commands.

If the memory cell group is to be read using a normal sense time, the memory controller sets memory device 24 to the normal readout configuration, at a normal setting step 128. If, on the other hand, the memory cell group is to be read using a reduced sense time, the memory controller sets the memory device to reduced-sense-time readout configuration, at a reduced-time setting step 132. The memory device then reads the memory cells in the group using the selected readout configuration, at a readout step 136. The memory controller outputs the read data, at an output step 140.

The embodiments described herein refer to a certain partitioning of tasks between the memory device and the memory controller. This choice, however, is made purely by way of example. In alternative embodiments, the tasks of evaluating the condition, selecting and setting the appropriate readout configuration and reading the memory cells can be divided in any desired way between the memory device and memory controller, or even performed exclusively by only one of them.

Typically, each of the memory cells belongs to a respective bit line. Readout is performed by pre-charging the bit lines, allowing them to discharge, and sensing the bit line currents or voltages after a certain discharge period. Thus, the sensed storage values depend on the bit line conductivity. In some of the disclosed techniques, the choice of readout configuration affects the electrical conductivities of the bit lines to which the memory cells in the group belong. Consequently, longer or shorter sense times can be set.

When the bit line conductivity is better (i.e., higher—meaning smaller bit line resistance), the bit line discharges at a faster rate and therefore can be sensed with a shorter sense time. When the bit line conductivity is poorer, the bit line discharges at a slower rate and therefore a longer sense time may be needed. Lower bit line conductivity is typically set only selectively, when possible or when required, because improving the bit line conductivity may degrade other system performance measures.

Various techniques can be used to selectively increase the bit line conductivity during readout. In some embodiments, the readout configurations differ from one another in the pass voltages ($V_{PASS}$) that are applied during readout to unselected word lines in the memory block, i.e., to the word lines other than the word line being read. In one embodiment, the normal readout configuration sets a certain default set of pass voltages. The reduced-sense-time readout configuration sets another set of pass voltages, at least one of which is higher than the corresponding pass voltage in the normal readout configuration.

Setting a higher pass voltage helps to improve the bit line conductivity, and therefore enables shorter sense time. On the other hand, increasing the pass voltage may increase the probability of over-programming, read disturb or other impairments. Therefore, this technique is typically used only selectively, e.g., when conditions permit, when other impairments are tolerable or when short sense time is particularly important.

In alternative embodiments, the readout configurations differ from one another in the read thresholds used for reading the group of memory cells. In one embodiment, the normal readout configuration sets a certain default set of (one or more) read thresholds. The reduced-sense-time readout configuration sets another set of read thresholds, at least one of which is higher than the corresponding read threshold in the normal readout configuration.

Figure 5:
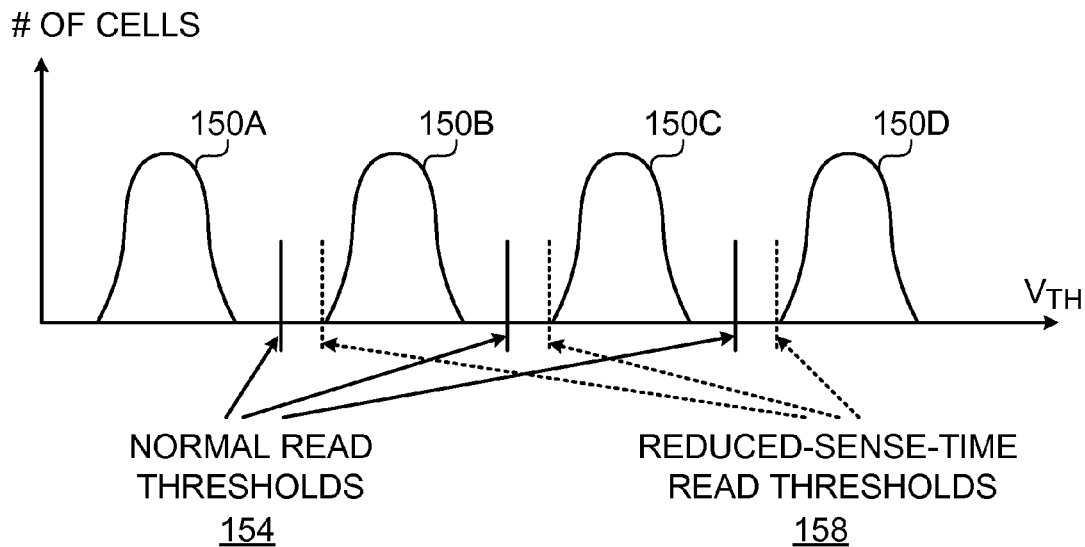
FIG. 5 is a graph showing programming levels in a group of analog memory cells and associated normal and reduced-sense-time read thresholds, in accordance with an embodiment of the present invention.

FIG. 5 is a graph showing programming levels in a group of analog memory cells and associated normal and reduced-sense-time read thresholds, in accordance with an embodiment of the present invention. The example of FIG. 5 refers to a group of four-level, 2 bits/cell memory cells. After programming, the storage values (in the present example threshold voltages) of the memory cells are distributed in four programming level distributions 150A . . . 150D, which correspond to the four possible two-bit combinations. Device 24 typically retrieves the data stored in these memory cells by positioning three read thresholds between the programming level distributions, and comparing the cell storage values to the read thresholds.

In some embodiments, normal read thresholds 154 are marked in the figure with solid lines. Reduced-sense-time read thresholds 158 are marked in the figure with dashed lines. As can be seen in the figure, the reduced-sense-time read thresholds are higher than the respective normal read thresholds.

Increasing a given read threshold helps to improve the bit line conductivity, and therefore enables the use of shorter sense time. On the other hand, the reduced-sense-time read thresholds may increase the probability of read errors, since they are typically closer to the programming level distributions in comparison with the corresponding normal read thresholds.

In the example of FIG. 5, the normal read thresholds are positioned approximately at the mid-way points between adjacent programming level distributions. This setting typically yields low error probability. The reduced-sense-time read thresholds, on the other hand, are positioned at the upper edges of the boundary regions separating the adjacent programming level distributions. This setting is typically sub-optimal in terms of error probability, but may be preferred in some cases in order to improve bit line conductivity and enable short sense time. In some embodiments, the reduced-sense-time read thresholds may be positioned even further higher, slightly within the programming level distributions. This setting further shortens sense time at the expense of read errors (which can be corrected, for example, using an error correction code).

In some embodiments, memory controller 52 sets the sense time for reading a certain word line depending on the number of other word lines in the same block that are programmed with data. The rationale behind this technique is that erased (non-programmed) memory cells improve the bit line conductivity, whereas programmed memory cells degrade it. When a memory block has only a small number of programmed word lines, the conductivity of the bit lines in the block is typically good, and it is typically possible to read the desired word line with a short sense time. If, on the other hand, the block has many programmed word lines (i.e., few erased cells per bit line), the bit line conductivities may be poorer and a longer sense time may be needed.

Readout Using Multiple Sense Times During the Same Bit Line Charge/Discharge Cycle In some embodiments, system 20 reads a certain group of memory cells (typically a page) using multiple sense times, during a single discharge cycle of the bit lines. Although the embodiments described below refer to two types of readout operations having different sense times, the disclosed techniques can be used with any other suitable number of readout operations that differ in sense time from one another.

As explained above, the memory cells along a selected word line are connected to respective bit lines that are used for readout. Memory device 24 reads a given page by pre-charging the bit lines, allowing the bit lines to discharge, and sensing the bit line current or voltage with a certain sense time. The sensed current or voltage of a given bit line is indicative of the threshold voltage of the memory cell connected to that bit line, and thus of the data stored in the memory cell.

Figure 6:
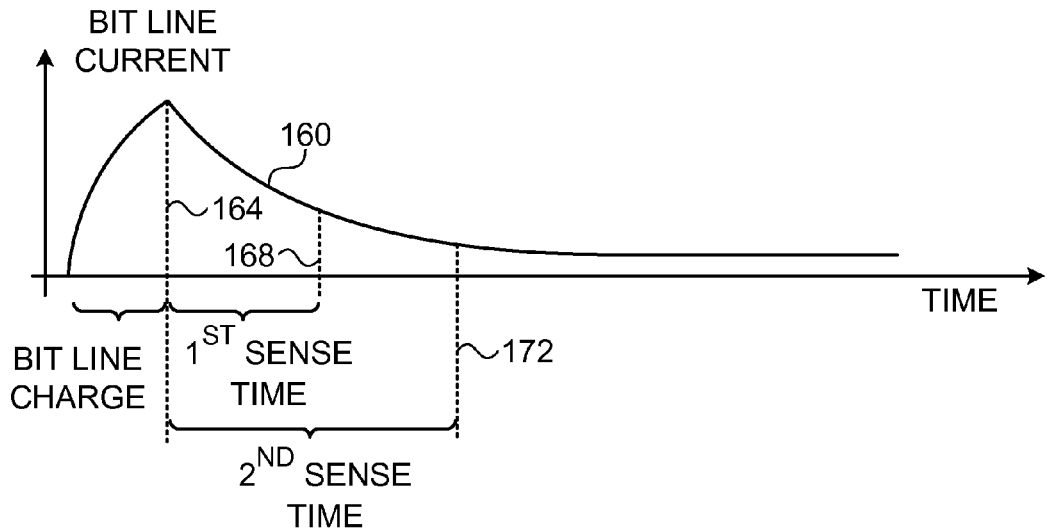
FIG. 6 is a graph showing the use of multiple sense times during a single bit line discharge cycle, in accordance with an embodiment of the present invention.

FIG. 6 is a graph showing the use of multiple sense times during a single bit line discharge cycle, in accordance with an embodiment of the present invention. A plot 160 shows the current flowing in a given bit line as a function of time. The figure refers to a single bit line for the sake of clarity. Typically, multiple memory cells connected to multiple respective bit lines are read in a similar manner in parallel. Although the embodiments described herein refer to sensing of the bit line current, the disclosed techniques can be implemented by sensing the bit line voltage, as well.

When preparing to read a group of memory cells along a selected word line (e.g., a page), the memory device pre-charges the bit lines of the memory block in question to a certain initial voltage. At a time 164, the bit lines are allowed to discharge. The discharge curve of the bit line is indicative of the bit line conductivity, and thus of the threshold voltage of the memory cell in the selected word line.

In some embodiments, sense circuitry 40 of the memory device senses the bit line current multiple times during the same discharge cycle, i.e., without re-charging the bit lines between readout operations. In the example of FIG. 6, a first readout operation senses the bit line current over the interval between times 164 and 168 (denoted "$1^{st}$ sense time" in the figure), and a second readout operation senses the bit line current over the interval between times 164 and 172 (denoted "$2^{nd}$ sense time" in the figure).

In an example embodiment, the bit line charge interval is on the order of 15 μS, and the bit line discharge interval is on the order of 25-35 μS. In another embodiment the bit line charge interval is on the order of 1 μS, and the bit line discharge interval is on the order of 40-50 μS. These figures, however, are given purely by way of example, and any other suitable values can be used in alternative embodiments.

The second readout operation senses (e.g., integrates) the bit line current over a longer time interval than the first readout operation, and is therefore typically more accurate. On the other hand, the second readout operation typically has longer latency than the first readout operation, because of the longer sense time. The embodiments described below combine the two types of readout operations in various ways, in order to provide efficient readout solutions.

The length and timing of the sensing times shown in FIG. 1 are depicted purely by way of example. In alternative embodiments, memory device 24 may apply any other suitable types of readout operations that differ in sense time from one another.

Figure 7:
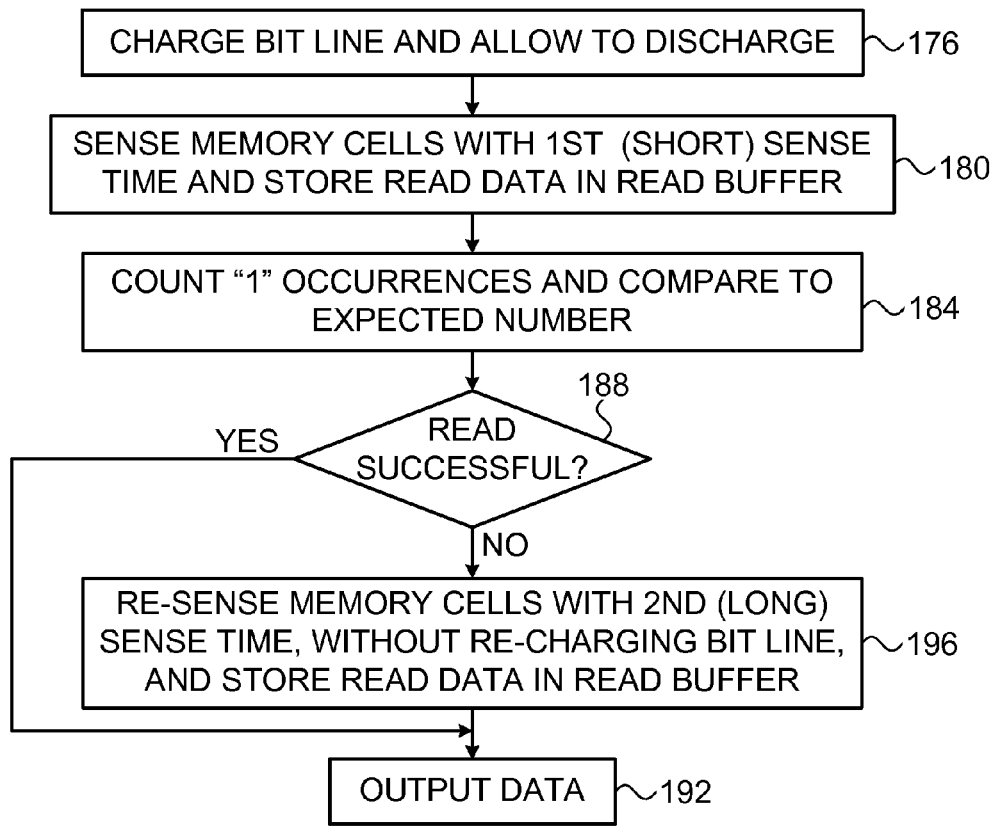
FIGS. 7-9 are flow charts that schematically illustrate readout schemes using multiple sense times during a single bit line discharge cycle, in accordance with embodiments of the present invention.

FIG. 7 is a flow chart that schematically illustrates a readout scheme using multiple sense times during a single bit line discharge cycle, in accordance with an embodiment of the present invention. In this embodiment, the memory device initially reads the memory cells with the first (shorter) sense time. After the initial sensing, the memory device executes a fast verification process that assesses whether the initial readout was successful (i.e., whether the first sense time is sufficient for successful readout). If the fast verification indicates that the readout may have failed, the memory device senses the memory cells again with the second (longer) sense time.

In the present example, the entire process is performed during the same bit line discharge cycle, i.e., without recharging the bit lines between the first and second readout operations. In alternative embodiments, however, the two sense operations can be performed in different discharge cycles.

The fast verification process is typically performed by signal processing unit 44 in the memory device. In one embodiment, sense circuitry 40 senses the bit lines with the first sense time and stores the readout results (binary "1" or "0" for each memory cell) in a read buffer. Signal processing circuitry 44 assesses the occurrence frequency of a given data value (e.g., the number of "1" occurrences or the number of "0" occurrences) in part or all of the read buffer. The signal processing circuitry compares the number of occurrences to an expected value, and indicates whether the readout is likely to have succeeded based on the comparison.

For example, when the stored data is scrambled, the likelihood of "1" and "0" is similar, and therefore each data value should occur in approximately 50% of the readout results. In such a case, circuitry 44 may verify whether the number of "1" or "0" occurrences is close to 50%, e.g., between 45% and 55%. Alternatively, any other suitable expected values can be used.

Circuitry 44 may count the number of "1" or "0" occurrences in various ways, e.g., using parallel hardware that counts the occurrences in a single cycle, or using serial hardware that scans the data in the buffer word by word. In an alternative embodiment, circuitry 44 converts the number of occurrences to a corresponding analog value (e.g., voltage level), and compares this analog value to an analog threshold that represents the expected value. Further alternatively, the counting and comparison may be performed by memory controller 52, provided that the interface between the memory device and the memory controller is fast enough to complete the process during the bit line discharge cycle. (As noted above, in alternative embodiments the process is not necessarily implemented during a single discharge cycle, e.g., the two sense operations can be performed in different discharge cycles.)

The method of FIG. 7 begins with memory device 24 charging the bit lines of the memory block in question and then allowing the bit lines to discharge, at a charging step 176. Sense circuitry 40 senses the memory cells along the selected word line (by sensing the respective bit lines) with the first sense time, at a first sensing step 180. Circuitry 40 stores the readout results in a read buffer.

Signal processing circuitry 44 then carries out a fast verification process on the results of the first readout operation. In the present example, circuitry 44 counts the number of occurrences of "1" data values in part or all of the read buffer, at a counting step 184. Circuitry 44 compares the number of occurrences to an expected value. Circuitry 44 checks whether the comparison indicates that the readout was successful, at a success checking step 188. If successful, memory device 24 outputs the readout results, at an output step 192, and the method terminates.

Otherwise, i.e., if the comparison indicates that the first readout operation is likely to have failed, sense circuitry 40 re-senses the bit lines with the second (longer) sense time, at a re-sensing step 196. Circuitry 40 stores the readout results in the read buffer, and outputs the readout results at step 192. As explained above, the entire process of first sensing, fast verification and second sensing is completed during the same bit line discharge cycle.

In alternative embodiments, the process of fast verification and re-sensing with a longer sense time can be repeated for any suitable number of iterations. In an example embodiment, the signal processing circuitry progressively increases the sense time and verifies the readout results, until the results meet a certain success criterion or until a certain time out expires.

The method of FIG. 7 enables system 20 to use a short sense time and achieve small latency when conditions permit (e.g., when distortion in the memory cells is low). When the distortion level is high, the method reverts to a longer sense time in order not to compromise readout reliability. Thus, the trade-off between latency and reliability is adjusted in an adaptive manner to match the actual conditions of the memory cells being read.

In some embodiments, sense circuitry 40 reads a page with reduced latency by reading a first subset of the memory cells of the page with a short sense time, and a second subset of the memory cells of the page with a longer sense time. The readout results of the first subset are transferred to memory controller 52 in parallel (or at least semi-parallel) to reading the second subset, so as to further reduce latency. The second subset can be read with a relatively long sense time since their readout results are transferred later. As a result, the second subset is read with higher accuracy.

In the present example, the two readout operations are performed within a single bit line discharge cycle. In alternative embodiment, however, the two readout operations may be performed in different discharge cycles.

Figure 8:
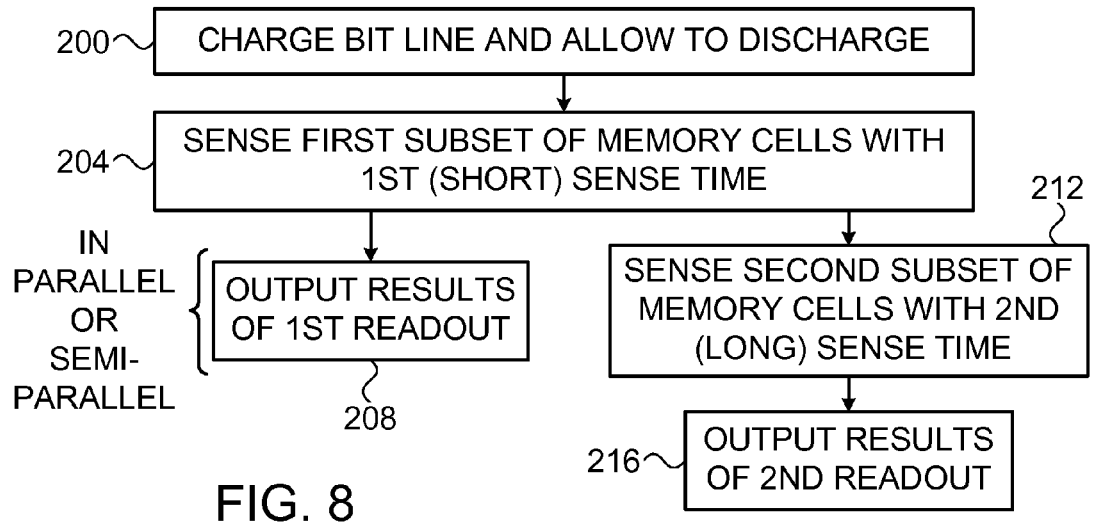

FIG. 8 is a flow chart that schematically illustrates a readout scheme using multiple sense times, in accordance with an embodiment of the present invention. The method begins with memory device 24 charging the bit lines of the memory block in question and allowing the bit lines to discharge, at a bit line charging step 200.

Sense circuitry 40 senses a first subset of the memory cells along the selected word line (by sensing the respective bit lines) with the first sense time, at a first readout step 204. The memory device transfers the readout results of the first subset to memory controller 52, at a first transfer step 208.

In parallel (or at least partial overlap) with step 208, sense circuitry 40 senses a second subset of the memory cells along the selected word line with the second sense time, at a second readout step 212. The memory device transfers the readout results of the second subset to memory controller 52, at a second transfer step 216.

As can be appreciated, the overall readout latency is reduced because the readout results of the first subset are transferred while the second subset is sensed. At the same time, the second subset is read with a relatively long sense time and thus high accuracy. The first subset is read with a relatively short sense time in order to start the transfer process early.

In some embodiments, sense circuitry 40 senses all the memory cells in the page using both the first and the second sense times. The memory device starts transferring the results of the first readout operation (which are available earlier than those of the second readout operation) while the second readout operation is in progress. As the results of the second readout operation become available, they are transferred, as well. If the readout results of the first readout operations are corrupted, the memory controller uses the results of the second readout operation. Both readout operations are performed within a single bit line discharge cycle.

Figure 9:
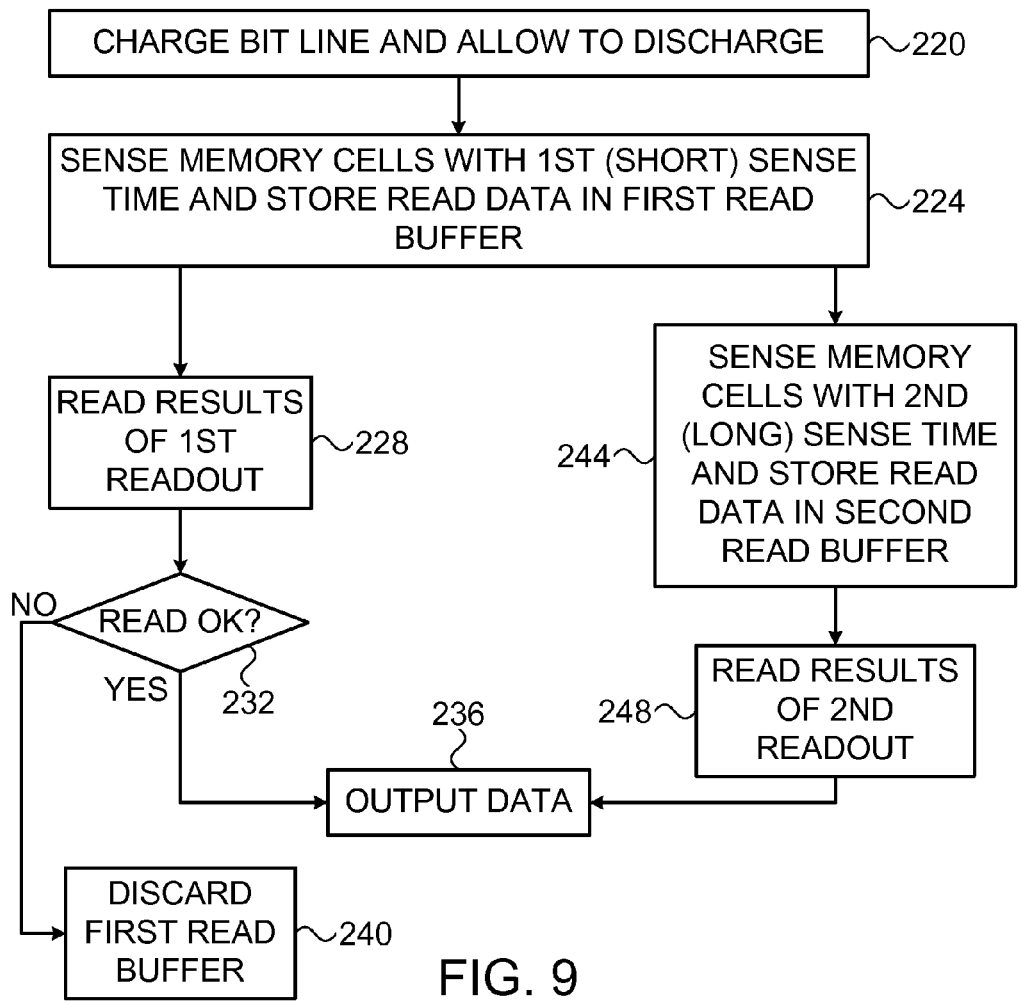

FIG. 9 is a flow chart that schematically illustrates a readout scheme using multiple sense times, in accordance with an embodiment of the present invention. The method begins with memory device 24 charging the bit lines of the memory block in question and allowing the bit lines to discharge, at a pre-charging step 220.

Sense circuitry 40 senses the memory cells along the selected word line (by sensing the respective bit lines) with the first sense time, at a first sense step 224. Circuitry 40 stores the results of the first readout operation in a first read buffer. Signal processing circuitry 44 reads the results of the first readout operation from the first buffer, at a first reading step 228.

Circuitry 44 checks whether the first readout results (which were read using a short sense time) are valid, at a validity checking step 232. The validity checking may comprise, for example, verifying a Cyclic Redundancy Check (CRC) of the data, decoding an Error Correction Code (ECC) that encodes the data, verifying that the number of occurrences of a certain data value is within an expected range, or any other suitable kind of verification. If the results of the first readout operation are valid, the memory device transfers them to memory controller 52, at a result transferring step 236, and the method terminates. Otherwise, the content of the first read buffer is discarded, at a discarding step 240.

In parallel to the process of steps 228-240 described above, sense circuitry 40 senses the memory cells along the selected word line (by sensing the respective bit lines) with the second sense time, at a second sense step 244. Circuitry 40 stores the results of the second readout operation in a second read buffer.

Signal processing circuitry 44 reads the results of the second readout operation from the second buffer, at a second reading step 248. Circuitry 44 transfers the results of the second readout operation to memory controller 52 at step 236.

In this example, the memory controller potentially receives two sets of results—one produced by the first readout operation and the other by the second readout operation. The memory controller may choose to use either set, e.g., the more accurate results of the second readout operation that arrive later, or the less accurate results of the first readout operation that arrive earlier.

In alternative embodiments, if the results of the first readout operation are found to be valid (at step 232), the memory device terminates the second readout operation, so that the memory controller will not receive two sets of results. In yet another embodiment, the memory device transfers the results of both read operations to the memory controller, regardless of validity. In this embodiment, step 232 may be performed by the memory controller.

Reading Multiple Parts of an ECC Code Word with Different Sense Times

As explained above, in some embodiments ECC unit 68 encodes the data to be stored in the memory device using an ECC, and decodes the ECC of data that is read from memory. Unit 68 is typically capable of correcting up to a certain maximum number of errors per ECC code word. When using a normal readout configuration and a reduced-sense-time readout configuration, however, the error probability of the reduced-sense-time readout configuration may be too high for unit 68 to decode the ECC successfully.

In some embodiments, system 20 overcomes this limitation by reading a part of each ECC code word using the normal readout configuration, and the remaining part of the code word using the reduced-sense-time readout configuration. The proportion between the two parts is set such that the average number of errors per code word is within the error correction capability of unit 68. As a result, the ECC code words can be decoded successfully, while at the same time the average latency is reduced.

In some embodiments, system 20 (e.g., memory controller 52 or signal processing unit 44 in memory device 24) divides each ECC code word into multiple parts and stores each part in a respective group of memory cells (e.g., a respective page). When retrieving a given code word from memory, the system reads one or more of the parts of the code word using the normal readout configuration, and the remaining part or parts using the reduced-sense-time readout configuration.

In some embodiments, the different parts of a given code word are stored in respective different memory devices, e.g., in different memory dies or memory planes. When reading the code word, the different devices are read in parallel, each device using the appropriate readout configuration. This parallel configuration further reduces readout latency. In alternative embodiments, however, different parts of a code word may be stored in the same memory device.

Figure 10:
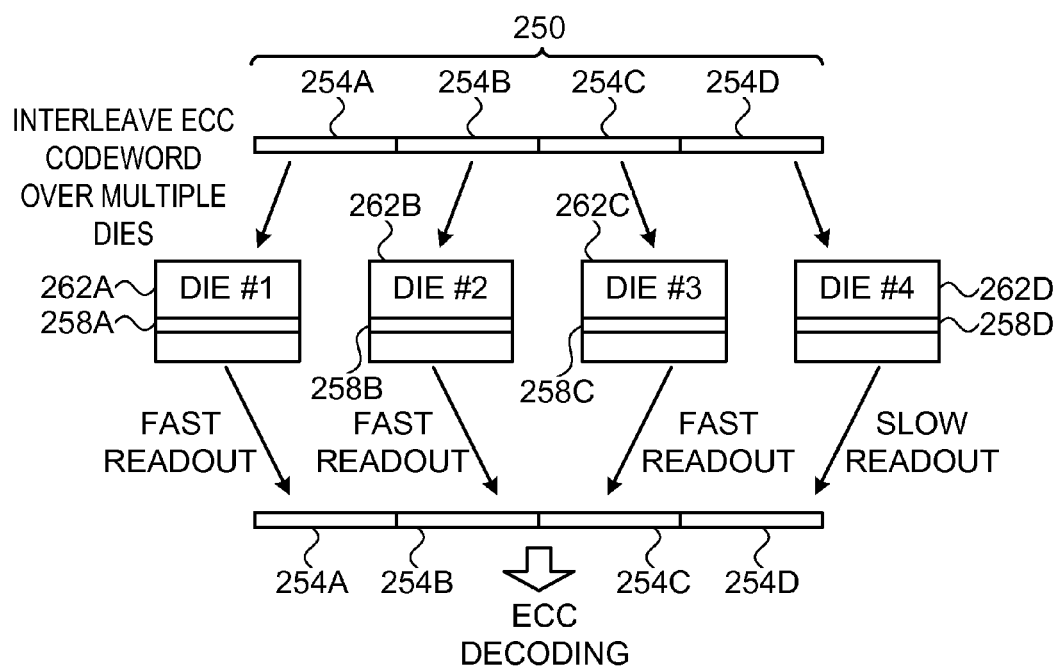
FIG. 10 is a diagram that schematically illustrates a readout process that combines multiple readout operations having different sense times, in accordance with an embodiment of the present invention.

FIG. 10 is a diagram that schematically illustrates the above-described readout process, in accordance with an embodiment of the present invention. In the present example, system 20 divides an ECC code word 250 into four parts denoted 254A . . . 254D. The system stores the four parts of the code word in four respective memory pages 258A . . . 258D belonging to four respective different memory dies 262A . . . 262D.

In order to retrieve the ECC code word from memory, system 20 reads pages 258A . . . 258C from dies 262A . . . 262C using the normal readout configuration (denoted "fast readout" in the figure), and reads page 258D from die 262D using the reduced-sense-time readout configuration (denoted "slow read" in the figure). The four readout operations reproduce parts 254A . . . 254D of ECC code word 250.

The reproduced code word is then provided to unit 68 for decoding. On average, each of parts 254A . . . 254C has a relatively large number of errors, while part 254D has a relatively small number of errors due to the longer sense time used for reading it. The proportion between the parts (¾ of the code word read using normal readout and ¼ of the code word read using reduced-sense-time readout) is set such that the average number of errors across the entire code word is within the error correction capability of unit 68.

The storage configuration of FIG. 10 is an example configuration, which is chosen purely for the sake of conceptual clarity. In alternative embodiments, any other suitable configuration can be used. For example, the ECC code word can be divided into any desired number of parts, and interleaved among any desired number of dies. The proportion between the number of parts read using normal readout and the number of parts read using reduced-sense-time readout can be set to any desired proportion.

In some embodiments, the data from the dies read using normal readout is transferred first to the memory controller, and the data from the dies read using reduced-sense-time readout is transferred last. This sort of data transfer minimizes the transfer latency. Alternatively, however, any other suitable transfer order can be used.

In some embodiments, system 20 alternates the readout configurations used for reading the various dies from one code word to another. In the present example, the system may apply the following alternation:

| Code word | Die #1 | Die #2 | Die #3 | Die #4 |
|---|---|---|---|---|
| I | FAST | FAST | FAST | SLOW |
| II | FAST | FAST | SLOW | FAST |
| III | FAST | SLOW | FAST | FAST |
| IV | SLOW | FAST | FAST | FAST |
| V | FAST | FAST | FAST | SLOW |
| ... | ... | ... | ... | ... |

In some embodiments, one or more of the dies are read using a read cache mode, in which the next page is read (sensed) from the memory cells while the readout results of the present page are being transferred to the memory controller. Using this mode further reduces readout latency.

In some embodiments, the memory cells comprise Multi-Level Cells (MLC), and system 20 reads certain MLC bits using the normal readout configuration, and other MLC bits using the reduced-sense-time readout configuration. For example, when using four-level (2 bits/cell) MLC, system 20 may read MSB pages using the normal readout configuration, and LSB pages using the reduced-sense-time readout configuration.

In some embodiments, the LSB and MSB programming level distributions are designed to match the normal and reduced-sense-time readout configurations. For example, the programming level distributions can be designed such that the LSB pages have, on average, fewer errors than the MSB pages. This sort of design helps to equalize the error probability in the MSB pages (which are read using fast readout that is less accurate) and LSB pages (which are read using normal readout that is more accurate).

In some embodiments, the storage configuration used in a certain page (e.g., programming level distributions) takes into account the readout configuration (normal or reduced-sense-time) with which the page will be read. In these embodiments, the readout configuration for a given page is fixed. In other embodiments, a given page is not necessarily read using a given readout configuration (i.e., a given page may be read using different readout configurations at different times).

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

What is claimed is:

1. A method, comprising:
   evaluating a condition with respect to a read operation that is to be performed by a memory, wherein the memory includes a plurality of memory cells;
   selecting one of a first read command and a second read command dependent upon the evaluated condition, wherein the first read command reads stored values at a first accuracy and the second read command reads stored values at a second accuracy, wherein the second accuracy is finer than the first accuracy; and
   sending the selected read command to the memory.

2. The method of claim 1, wherein the first read command has a first execution time, and the second read command has a second execution time, wherein the second execution time is greater than the first execution time.

3. The method of claim 1, wherein the first read command causes the stored values to be sensed for a first period of time, and the second read command causes the stored values to be sensed for a second period of time, the second period of time longer than the first period of time.

4. The method of claim 1, wherein the first read command causes the stored values to be read using a first number of read thresholds, and the second read command causes the stored values to be read using a second number of read thresholds, wherein the second number of read thresholds is greater than the first number of read thresholds.

5. The method of claim 4, wherein the first read command produces hard metrics associated with the read values, and the second read command produces soft metrics associated with the read values.

6. The method of claim 1, wherein evaluating the condition comprises assessing a wear level of at least a portion of the memory cells.

7. The method of claim 6, wherein the wear level is represented by a number of program and erase cycles undergone by the at least a portion of the memory cells.

8. The method of claim 6, wherein the wear level is represented by a retention period for data stored in the at least a portion of the memory cells.

9. The method of claim 1, wherein evaluating the condition comprises determining that at least one memory cell of the memory may potentially interfere with one or more of the memory cells to be read.

10. The method of claim 9, wherein the second read command is selected responsive to a determination that at least one memory cell of the memory may potentially interfere with one or more of the memory cells to be read.

11. The method of claim 10, wherein the second read command causes an interference cancellation process to be performed.

12. The method of claim 10, wherein the first read command does not cause interference processing to be performed.

13. The method of claim 1, wherein evaluating the condition and selecting one of the read commands comprises selecting the first read command responsive to a determination that the read operation reads stored values from potentially-interfering memory cells.

14. The method of claim 1, wherein evaluating the condition and selecting one of the read commands comprises selecting the second read command responsive to a failure to successfully read the stored values using the first read command.

15. The method of claim 14, wherein the stored values are encoded with an error correction code (ECC) and the failure comprises a failure to successfully decode the ECC with a result of the first read command.

16. The method of claim 15, wherein results of both the first read command and the second read command are used to decode the ECC.

17. The method of claim 1, wherein evaluating the condition and selecting one of the read commands comprises selecting the first read command responsive to a determination that results of the read operation will be used to estimate a statistical distribution of values stored in at least a portion of the memory.

18. The method according to claim 1, wherein evaluating the condition and selecting one of the read commands comprises selecting the first read command responsive to a determination that results of the read operation will be used to verify the storage values previously written to the memory cells.

19. The method according to claim 1, wherein evaluating the condition and selecting the one of the read commands comprises selecting the first read command responsive to a determination that the read operation reads a first level of a multi-level memory cell, and selecting the second read command responsive to a determination that the read operation reads a second level from the multi-level memory cell.

20. The method of claim 1, wherein evaluating the condition and selecting the one of the read commands comprises selecting the first read command responsive to a determination that at least a portion of the memory cells are at the beginning of a life cycle.

21. An apparatus, comprising:
a processor configured to:
evaluate a condition with respect to a read operation that is to be performed by a memory, wherein the memory is comprised of a plurality of memory cells;
select one of a first read command and a second read command dependent upon the evaluated condition, wherein the first read command reads values stored in the memory at a first accuracy and the second read command reads the values stored in the memory at a second accuracy, wherein the second accuracy is finer than the first accuracy; and
an interface coupled to the processor, the interface configured to send the selected command to the memory.

22. The apparatus of claim 21, wherein the apparatus is part of a memory controller.

23. The apparatus of claim 21, wherein the apparatus is part of a memory device that comprises the memory.

24. The apparatus of claim 21, wherein the first read command has a first execution time, and the second read command has a second execution time, wherein the second execution time is greater than the first execution time.

25. The apparatus of claim 21, wherein the first read command causes the stored values to be sensed for a first period of time, and the second read command causes the stored values to be sensed for a second period of time, the second period of time longer than the first period of time.

26. The apparatus of claim 21, wherein the first read command causes the stored values to be read using a first number of read thresholds, and the second read command causes the stored values to be read using a second number of read thresholds, wherein the second number of read thresholds is greater than the first number of read thresholds.

27. The apparatus of claim 26, wherein the first read command produces hard metrics associated with the read values, and the second read command produces soft metrics associated with the read values.

28. The apparatus of claim 21, wherein evaluating the condition comprises assessing a wear level of at least a portion of the memory cells.

29. The apparatus of claim 28, wherein the wear level is represented by a number of program and erase cycles undergone by the at least a portion of the memory cells.

30. The apparatus of claim 28, wherein the wear level is represented by a retention period for data stored in the at least a portion of the memory cells.

31. The apparatus of claim 21, wherein evaluating the condition comprises determining that at least one memory cell of the memory may potentially interfere with one or more of the memory cells to be read.

32. The apparatus of claim 31, wherein the second read command is selected responsive to a determination that at least one memory cell of the memory may potentially interfere with one or more of the memory cells to be read.

33. The apparatus of claim 32, wherein the second read command causes an interference cancellation process to be performed.

34. The apparatus of claim 32, wherein the first read command does not cause interference processing to be performed.

35. The apparatus of claim 21, wherein evaluating the condition and selecting one of the read commands comprises selecting the first read command responsive to a determination that the read operation reads stored values from potentially-interfering memory cells.

36. The apparatus of claim 21, wherein evaluating the condition and selecting one of the read commands comprises selecting the second read command responsive to a failure to successfully read the stored values using the first read command.

37. The apparatus of claim 33, wherein the stored values are encoded with an error correction code (ECC) and the failure comprises a failure to successfully decode the ECC with a result of the first read command.

38. The apparatus of claim 37, wherein results of both the first read command and the second read command are used to decode the ECC.

39. The apparatus of claim 21, wherein evaluating the condition and selecting one of the read commands comprises selecting the first read command responsive to a determination that results of the read operation will be used to estimate a statistical distribution of values stored in at least a portion of the memory.

40. The apparatus of claim 21, wherein evaluating the condition and selecting one of the read commands comprises selecting the first read command responsive to a determination that results of the read operation will be used to verify the storage values previously written to the memory cells.

41. The apparatus of claim 21, wherein evaluating the condition and selecting the one of the read commands comprises selecting the first read command responsive to a determination that the read operation reads a first level of a multi-level memory cell, and selecting the second read command responsive to a determination that the read operation reads a second level from the multi-level memory cell.

42. The apparatus of claim 21, wherein evaluating the condition and selecting the one of the read commands comprises selecting the first read command responsive to a determination that at least a portion of the memory cells are at the beginning of a life cycle.

\* \* \* \* \*